(12) United States Patent
Shuto et al.

(10) Patent No.: US 6,471,816 B1
(45) Date of Patent: Oct. 29, 2002

(54) METHOD OF SOLAR BATTERY OUTPUT SECTION FABRICATION

(75) Inventors: Hidekazu Shuto, Mihara-gun (JP); Nobuo Hanehira, Tsuna-gun (JP); Hiroyuki Mori, Tsuna-gun (JP); Masayoshi Ono, Sumoto (JP); Yoshinobu Takabatake, Sumoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/537,864

(22) Filed: Mar. 29, 2000

(30) Foreign Application Priority Data

Mar. 31, 1999 (JP) .......................................... 11-093123

(51) Int. Cl.[7] .............................................. H01L 31/00
(52) U.S. Cl. ...................... 156/256; 156/257; 156/268; 136/257; 136/251; 136/244; 438/64; 438/83; 438/98; 257/431; 427/96; 427/289
(58) Field of Search ................................ 156/252, 253, 156/256, 257, 268; 136/257, 251, 244; 438/64, 83, 98; 257/431; 427/96, 289; 101/129

(56) References Cited

U.S. PATENT DOCUMENTS

5,717,255 A 2/1998 Haga et al. ................. 257/781
6,133,521 A * 10/2000 Haga et al. ................. 136/256

FOREIGN PATENT DOCUMENTS

| JP | 7-231015 | 8/1995 |
| JP | 10-256578 | 9/1998 |

* cited by examiner

*Primary Examiner*—Linda Gray
(74) *Attorney, Agent, or Firm*—Wenderoth, Lind & Ponack, L.L.P.

(57) ABSTRACT

In this method of solar battery output section fabrication, a metal foil is attached to an output terminal on a substrate surface, or a resin film is disposed over a conductive paste as the output terminal on the substrate surface. Subsequently, an opening is cut-out from the back side of the substrate to the metal foil or the conductive paste with a periphery cutter. Or, after the metal foil and a front side protective film is provided over the output terminal on the substrate surface, an opening is cut-out from the surface of the front side protective film to the metal foil with a periphery cutter.

37 Claims, 18 Drawing Sheets

METHOD OF SOLAR BATTERY OUTPUT SECTION FABRICATION

The application is base on application No. 11-93123 filed in Japan on Mar. 31, 1999, the contents of which is incorporated hereinto by reference.

BACKGROUND OF THE INVENTION

This invention relates to a method of fabrication for the output section of a solar battery.

The structure aid method of fabrication of a prior art solar battery output section is described in Japanese Non-examined Patent Publication HEI 7-231012 (1995). The fabrication method cited in this application has a process step to fix metal foil to output terminals on the front side of a solar battery, a process step to form a protective film from thermo-plastic resin on top of the solar battery including the metal foil, and a process step to provide openings formed by heating in the protective film above the metal foil using a device such as a soldering iron.

Another prior art solar battery output section structure and method of fabrication is described in Japanese Non-examined Patent Publication HEI 10-256578 (1998). The fabrication method cited in this application has a process step to provide openings through the solar battery and through output terminals on the front side of the solar battery, a process step to attach metal foil over the openings on the back side of the solar battery, and a process step to establish conductive paste inside the openings to electrically connect output terminals and metal foil.

For these types of prior art structures and methods of fabrication, the following problems exist. In the structure and method 6f fabrication cited in Japanese Non-examined Patent Publication HEI 7-231015 (1995) above, openings are provided by heating protective film above the metal foil using a device such as a soldering iron. As a result, residue of solidified thermoplastic resin remain within the openings after their heat formation. Consequently, when leads are solder attached, sufficiently strong connections cannot be obtained because of the thermo-plastic resin residue. Further, providing openings by heating with a device such as a soldering iron does not lend itself to manufacturability.

The structure and method of fabrication described in Japanese Non-examined Patent Publication HEI 10-256578 (1998) electrically connects front side output terminals to conductive paste disposed within openings. Compared with electrical connection by direct contact of metal foil with the output terminals, this system cannot obtain sufficiently low electrical resistance.

The present invention was developed to solve these types of problems. It is thus an object of the present invention to provide a method of solar battery output section fabrication which is efficient for manufacture and results in low electrical resistance values.

The above and further objects and features of the invention will more fully be apparent from the following detailed description with accompanying drawings.

SUMMARY OF THE INVENTION

This invention is characterized by a process step to attach metal foil on output terminals formed on the front side of a substrate, and a process step to cut-out openings to the metal foil from the back side of the substrate with a periphery cutter (analogous to a cookie cutter).

Further, this invention is characterized as well by a process step to attach metal foil on output terminals formed on the front side of a substrate, a process step to form a front side protective film on the substrate including the metal foil, and a process step to cut-out openings to the metal foil from above the protective film on the front side with a periphery cutter.

Still further, this invention is characterized by a process step to establish conductive paste, which forms output terminals, on the front side of a substrate, a process step to establish a resin film which covers the conductive paste, and a process step to cut-out openings to the conductive paste from the back side of the substrate with a periphery cutter.

In the method described above, solar battery output can be taken from the back side by providing output path openings, which are cut-out with a periphery cutter from the back side of the substrate to the metal foil. Since the back side of the metal foil is exposed within the openings, electrical connection to the foil via material such as solder can produce sufficiently low electrical resistance connections. In addition, since openings are cut-out with a periphery cutter, the method is efficient for manufacture.

Further in the method described above, solar battery output can be taken from the front side by providing output path openings, which are cut-out with a periphery cutter from the front side of the substrate to the metal foil. Since the front side of the metal foil is exposed within the openings, electrical connection to the foil via material such as solder can produce sufficiently low electrical resistance connections. In addition, since openings are cut-out with a periphery cutter, the method is efficient for manufacture.

Finally, in the method described above, solar battery output can be taken from the back side by providing output path openings, which are cut-out with a periphery cutter from the back side of the substrate to the conductive paste. Since the back side of the conductive paste is exposed within the openings, electrical connection to the conductive paste via material such as conductive resin can produce sufficiently low electrical resistance connections. In addition, since openings are cut-out with a periphery cutter, the method is efficient for manufacture.

DETAILED DESCRIPTION OF THE INVENTION

Figure 1A:
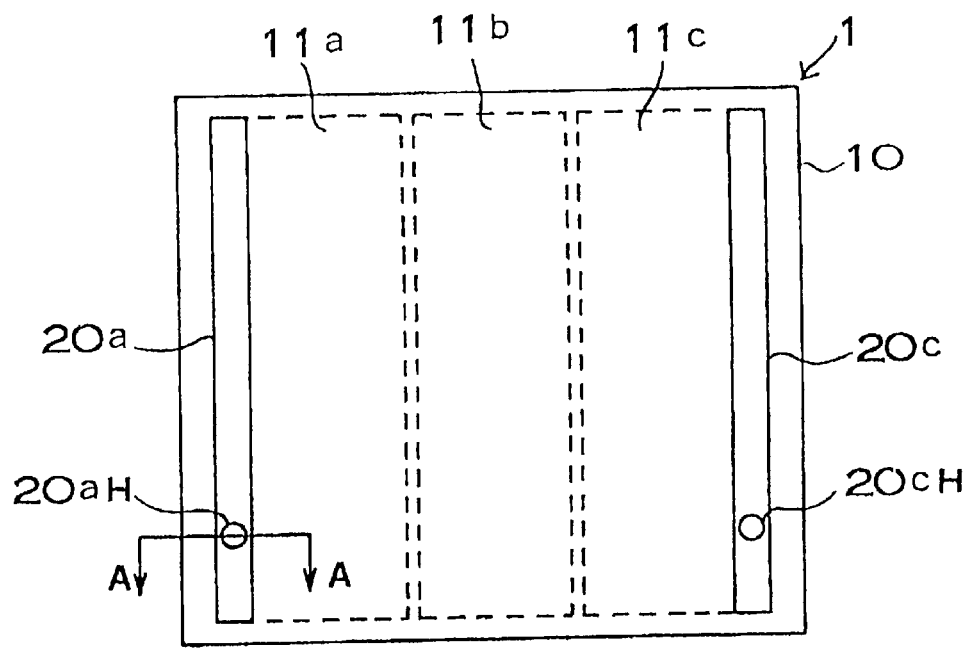
FIG. 1(a) is a plan view showing the first process step of the first embodiment of the present invention.

The following describes a solar battery, which is the first embodiment of the present invention, with reference to FIGS. 1 through 5. FIG. 1 shows a solar battery module 1 of this embodiment during fabrication. In FIG. 1, 10 is a heat resistant resin film substrate of a material with plastic properties such as a polyimide, and its thickness is 10 µm to 500 µm. 11a, 11b, and 11c are solar battery device elements formed on a front side of the substrate 10 with each element connected in series. 20a and 20c are conductive paste output terminals extending parallel to left and right edges of the substrate 10, respectively. The output terminals 20a and 20c conduct output from solar, battery elements 11a, 11b, and 11c to external points. In addition, the output terminals 20a and 20c have circular open regions 20aH and 20cH corresponding to openings 28 discussed later. Since the detailed description of the solar battery module 1 structure is the same as that disclosed in Japanese Patient Application HEI 7-231015 (1995), explanation is abbreviated.

Figure 1B:
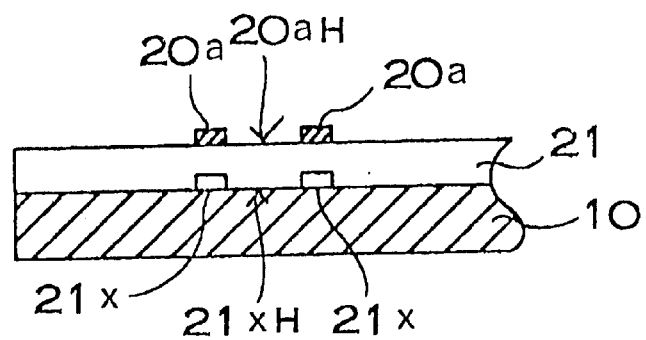
FIG. 1(b) is an enlarged cross-sectional view at A—A in FIG. 1(a).
Figure 2:
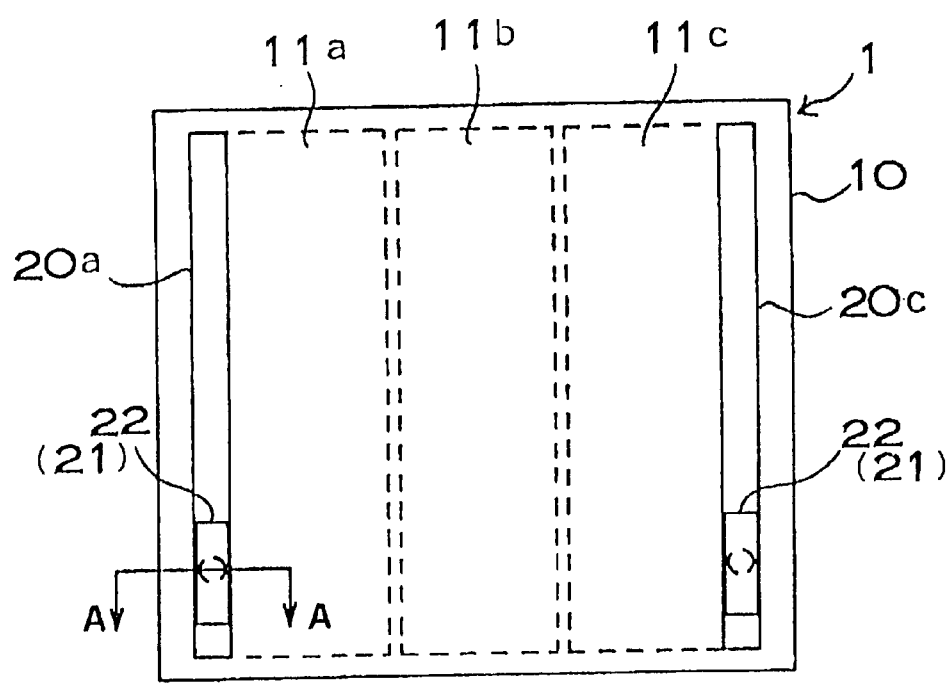
FIG. 2(a) is a plan view showing the second process step of the first embodiment of the present invention.
FIG. 2(b) is an enlarged cross-sectional view at A—A in FIG. 2(a).
Figure 2:
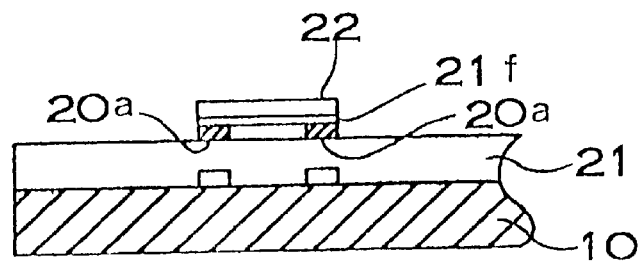
Figure 3:
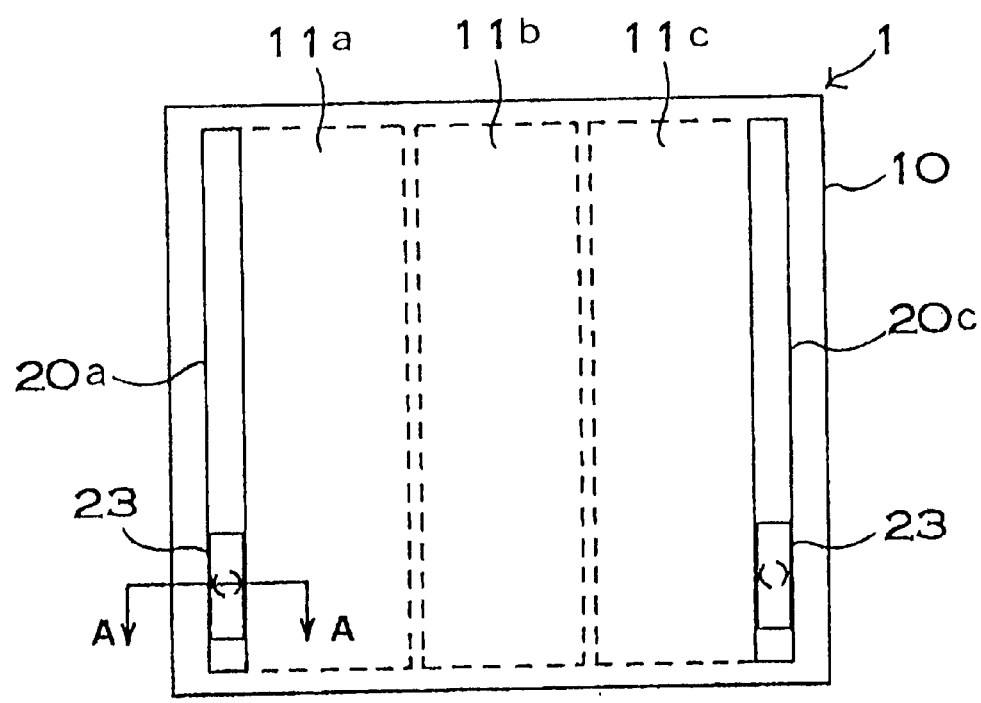
FIG. 3(a) is a plan view showing the third process step of the first embodiment of the present invention.
FIG. 3(b) is an enlarged cross-sectional view at A—A in FIG. 3(a).
Figure 3:
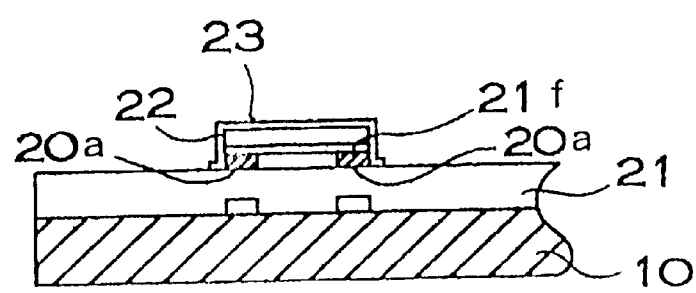
Figure 4:
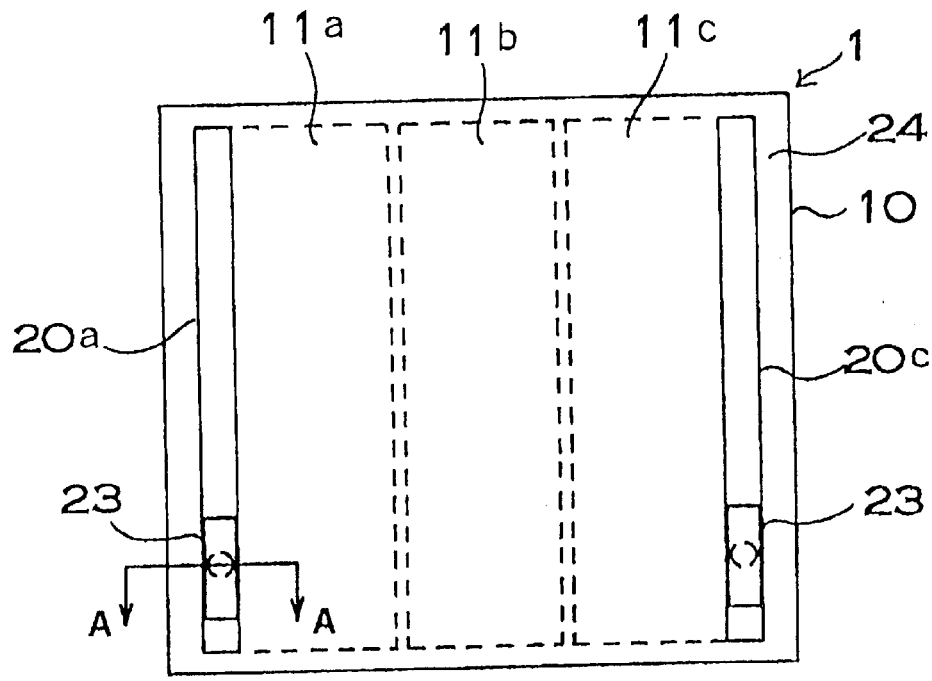
FIG. 4(a) is a plan view showing the fourth process step of the first embodiment of the present invention.
FIG. 4(b) is an enlarged cross-sectional view at A—A in FIG. 4.
Figure 4:
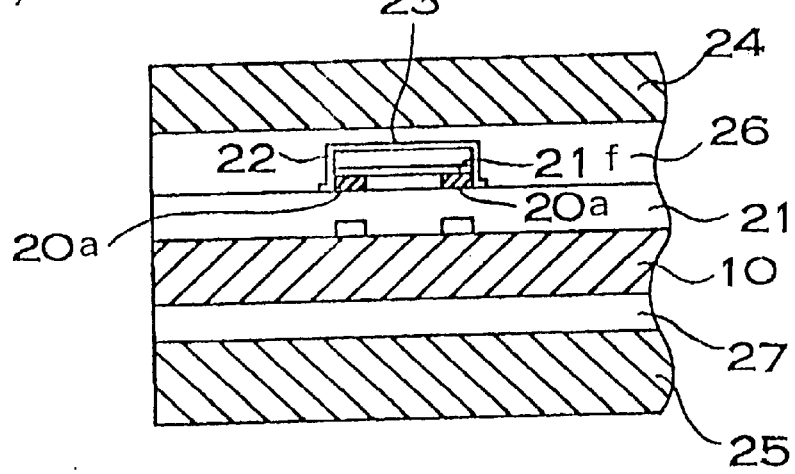

FIG. 1(b) shows the cross-sectional structure of output terminal 20a. Since the cross-sectional structure of output terminal 20c is the same as that of output terminal 20a, its description is omitted. In FIG. 1(b), 21 is an output terminal area laminate. As disclosed in Japanese Non-examined Patent Publication HEI 7-231015 (1995), the output terminal area laminate from the substrate 10, is conductive paste, a backside electrode layer, a light active semiconductor layer such as amorphous silicon, and a transparent conductive layer. Here, conductive paste 21X in the output terminal area laminate 21 has a circular open region 21XH corresponding to opening 28 discussed later. This open region 21XH eliminates cracks in the conductive paste 21X generated when the opening 28 is established.

Again, since the substrate right side output section has the same method of fabrication and structure as the left side, its description is omitted in the following.

Next, in the process step shown in FIGS. 2(a) and 2(b), after a rectangular piece of metal foil 22 is positioned temporarily on output terminal 20a near its lower end with an intervening anisotropic conductive film 21f having the same shape, it is pressure attached with heat from above the metal foil 22. As a result of this pressure and heat, anisotropic conductive film 21f in the region of pressure application becomes conductive, and the output terminal 20a and metal foil 22 become electrically connected. Here, the metal foil 22 is made of copper and the entire surface thereof is covered with solder plating. The solder plating is approximately 20 µm thick, and the total film thickness of the metal foil 22 is approximately 140 µm. It is possible to use a metal foil with an approximate thickness of 50 µm to 300 µm. It is also possible to use a conductive adhesive in place of the anisotropic conductive film 21f. In the case of a conductive adhesive, it is applied to the bottom of the metal foil 22, excluding the circular region corresponding to the open region 20aH. Acrylic based adhesives impregnated with metal powder such as nickel can be used as the conductive adhesive.

In the process step shown in FIG. 3(a) and FIG. 3(b), a rectangular piece of adhesive tape 23 is placed to cover the metal foil 22 on the front side of the substrate 10 and fix the metal foil 22 in place. This adhesive tape 23 is a polyethylene terephthalate (PET) film approximately 30 µm thick with an adhesive layer on one side, and is transparent.

Next, in the process step shown in FIGS. 4(a) and 4(b), a front side transparent protective film 24 is formed over the entire solar battery module 1 front side, and a back side protective film 25 is formed over the entire substrate 10 back side. These protective films 24, 25 are films such as polyethylene terephthalate (PET) or fluoroplastics approximately 25 µm to 1000 µm thick with adhesive layers 26, 27 of thermoplastic resin such as ethylene vinyl acetate (EVA) copolymer (approximately 20 µm to 100 µm thick) attached to one side thereof, respectively. The front side protective film 24 and the back side protective film 25 are simultaneously laminated by passing the solar battery module 1 through a heat roller. Instead of this laminating method, the protective films may also be formed by using a vacuum, heat, and pressure attachment method, which pressure attaches the films under vacuum while applying heat. Materials such as ethylene vinyl acetate (EVA) copolymer and polyvinyl butyl (PVB) can be used as the adhesive layers.

To reduce moisture intrusion at the periphery of the substrate 10, the front side protective film 24 and the back side protective film 25 can be made larger in area than the substrate 10 and both protective films can be joined together outside of the substrate 10 periphery for a hermetically sealed structure.

Figure 5A:
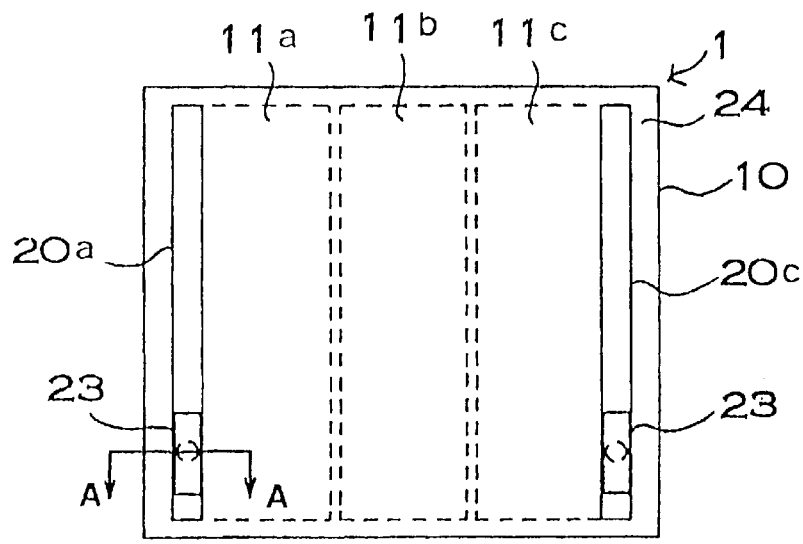
FIG. 5(a) is a plan view showing the fifth process step of the first embodiment of the present invention.
Figure 5B:
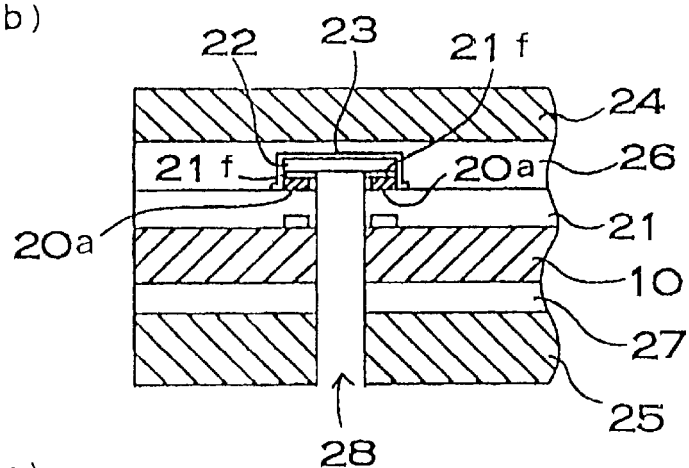
FIG. 5(b) is an enlarged cross-sectional at A—A in FIG. 5(a)
Figure 5C:
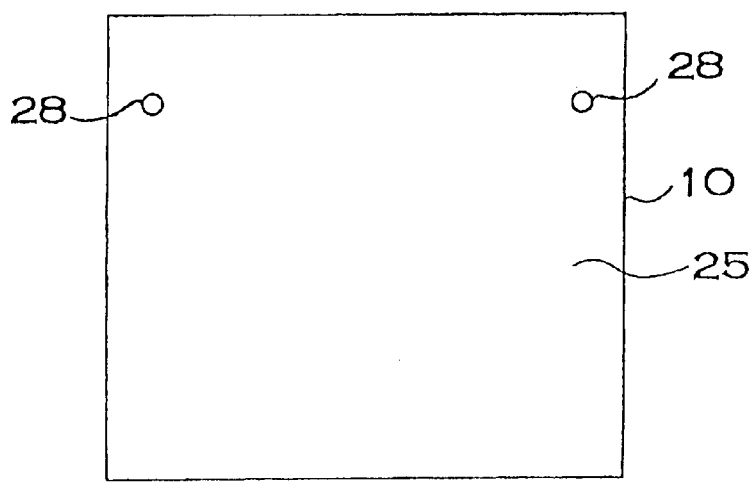
FIG. 5(c) is a bottom view of FIG. 5(a).
Figure 7:
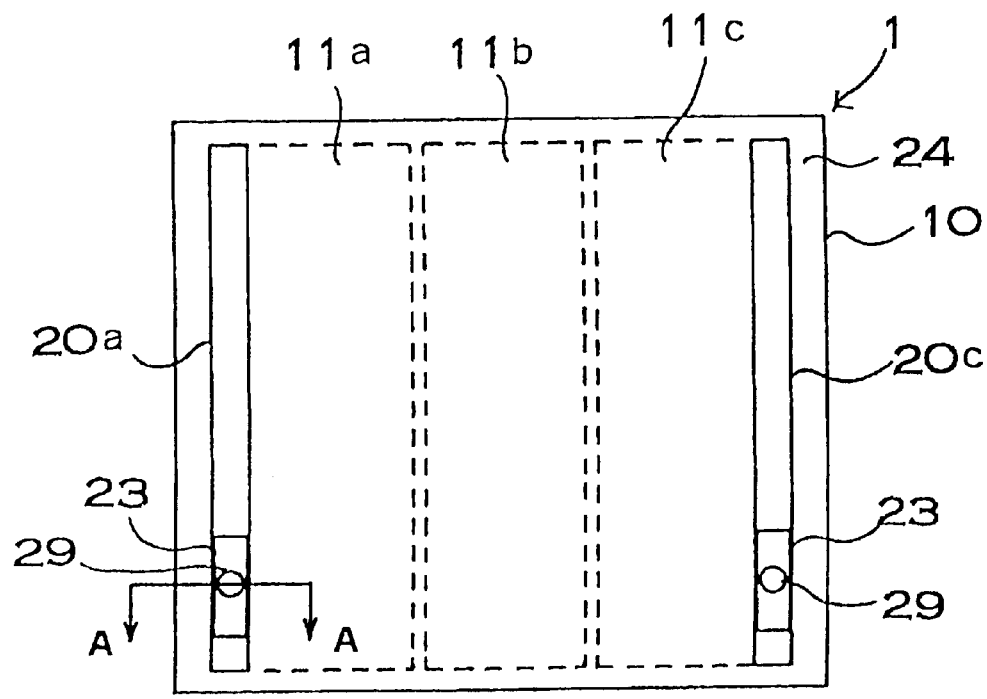
FIG. 7(a) is a plan view showing the seventh process step of the first embodiment of the present invention.
FIG. 7(b) is an enlarged cross-sectional at A—A in FIG. 7(a).
Figure 7:
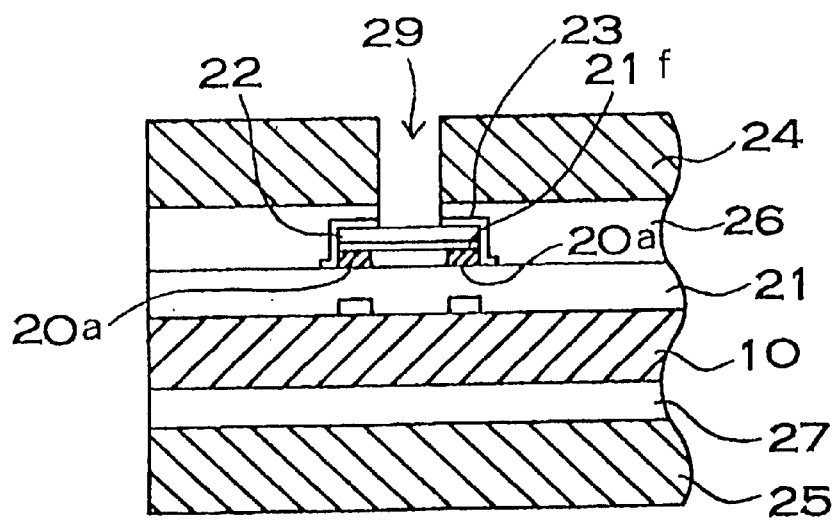

In the next processing, the process step shown in FIGS. 5(a), 5(b) and 5(c) is adopted for the case where output is taken from the back side of the substrate 10. Conversely, the process step shown in FIGS. 7(a) and 7(b) is adopted for the case where output is taken from the front side of the substrate 10.

As shown in FIG. 5(b) for the case where output is taken from the back side of the substrate 10, a circular opening 28 (1 mm to 2 mm diameter) is provided from the back side protective film 25 to the metal foil 22. As a result, the back side of the mental foil 22 is exposed inside the opening 28. concerning the method of providing the opening 28, a cut-out method using a circular periphery cutter (Thomson type cutter) is employed. The stroke of the cutter is adjusted so that the tip of the cutter blade reaches, and cuts slightly into the !metal foil 22 during the cut-out operation. In this type of cut-out method, the stroke of the cutter can be adjusted in increments of approximately 10 $\mu$m. Since the total film thickness of the metal foil 22 described above is approximately 140 $\mu$m, by adjusting the cutter stroke so that the cutter will not pierce through the metal foil 22, and cuts to a slight degree into the foil, process dispersion in this step during mass production (i.e. in some cases the cutter does not reach the metal foil 22 and in some cases the cutter passes completely through the metal foil 22) can be absorbed and an opening 28, as shown in FIG. 5(b), can be established. Concerning the shape of the opening 28 or more specifically the shape of the cutter, it must be mentioned that it is not limited or a circular shape and shapes such as square or polygonal may also be used.

In the cut-out region (the region of opening 28), the anisotropic conductive film 21f was not pressure attached with heat because of the circular open region 20aH in output terminal 20a. Therefore, the remaining laminate core within the opening 28 (specifically, anisotropic conductive film 21f, output terminal area, laminate 21, substrate 10, adhesive layer 27, and back side protective film 25) can be easily removed. Further, in the case where the anisotropic conductive film 21f is replaced by a conductive adhesive as described previously, the conductive adhesive is not applied to the circular region corresponding to the open region 20aH. Therefore, the laminate core within the opening 28 (specifically, output terminal area laminate 21, substrate 10, adhesive layer 27, and back side protective film 25) can also be easily removed.

Figure 6:
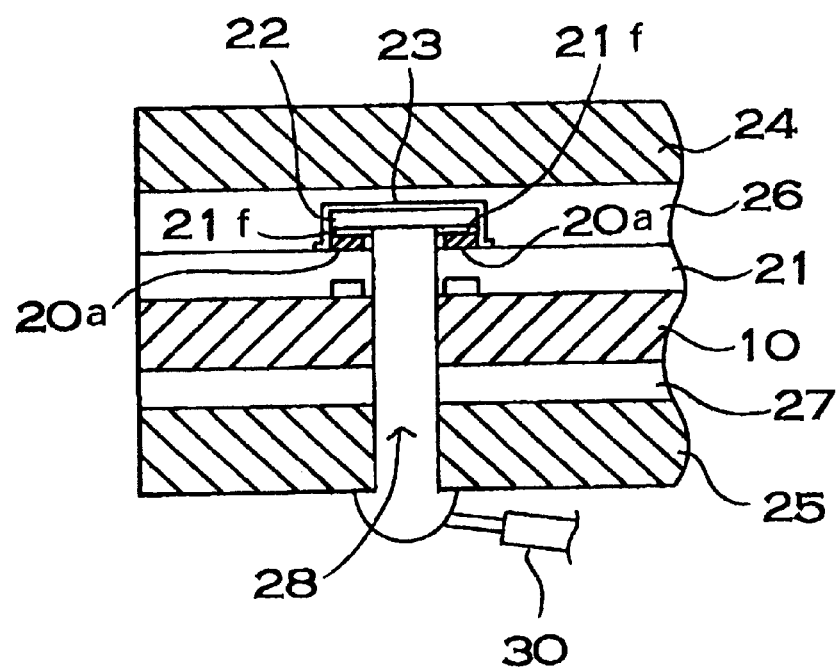
FIG. 6 is a cross-sectional view showing important elements of the sixth process step of the first embodiment of the present invention.

Finally, in the process step shown in FIG. 6, a lead wire 30 is solder attached to the back side of the metal foil 22 from the back side of the solar battery to complete fabrication of the solar battery including the output section.

Alternatively, as shown in FIGS. 7(a) and 7(b) for the case where output is taken from the front side of the substrate 10, a circular, opening 29 is provided from the front side protective film 24 to the metal foil 22. As a result, the front side of the metal foil 22 is exposed inside the opening 29. Concerning the method of providing an opening 29, it is the same as that previously described for providing opening 28.

In the cut-out region (the region of opening 29), adhesive tape 23 covers the metal foil 22. Although the adhesive tape 23 attaches to the metal foil 22 via an adhesive layer, the attachment is between a metal and a resin material, and thus, the attachment strength is relatively low. Further, adhesive layer 26 adheres to adhesive tape 23, and since the adhesive tape 23 substrate material is a film such as PET, its attachment strength with another resin material in the adhesive layer 26 is relatively high. Consequently, the adhesive layer of the adhesive tape 23 does not remain on the metal foil 22, and the remaining laminate core within the opening 29 (specifically, adhesive tape 23, adhesive layer 26, and front side protective film 24) can be easily removed.

Figure 8:
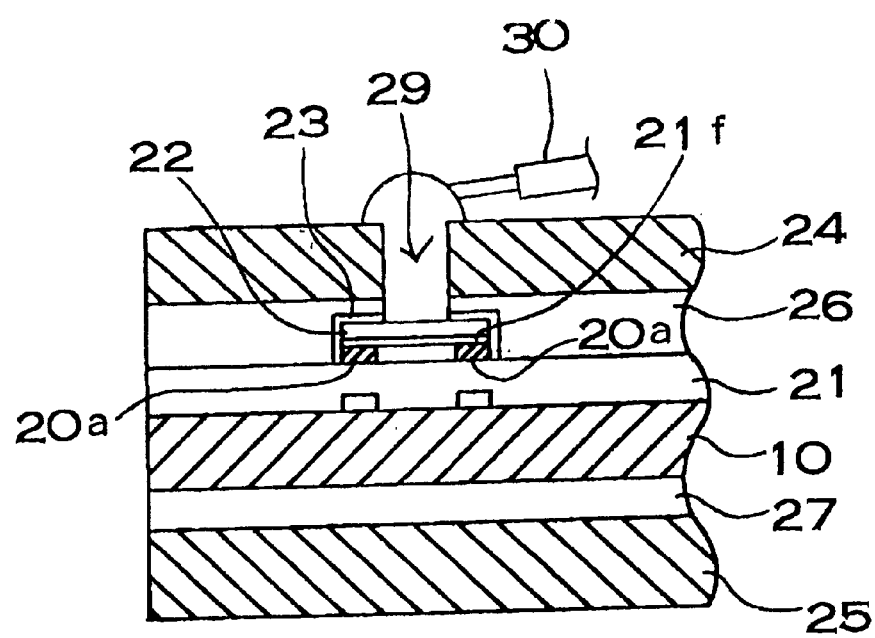
FIG. 8 is a cross-sectional view showing important elements of the eighth process step of the first embodiment of the present invention.

Finally, in the process step shown in FIG. 8, a lead wire 30 is solder attached to the front side of the metal foil 22 from the front side of the solar battery to complete fabrication of the solar battery including the output section.

A second embodiment of the present invention is now described with reference to FIGS. 9(a) through 13. Here, structural elements which are the same as those of the first embodiment use the same names and labels, and their description is abbreviated.

Figure 9A:
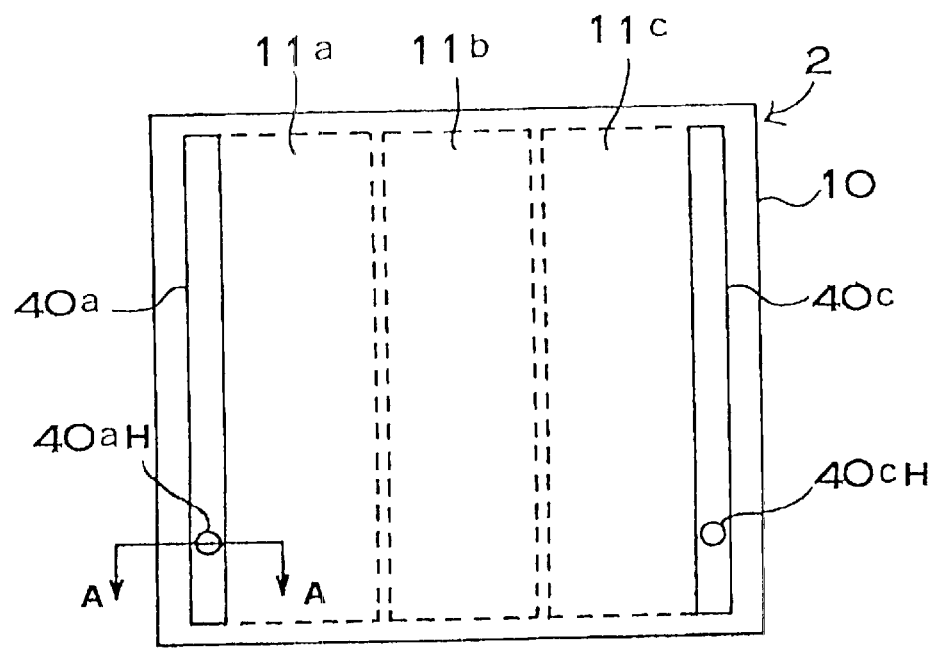
FIG. 9(a) is a plan view showing the first process step of the second embodiment of the present invention.
Figure 9B:
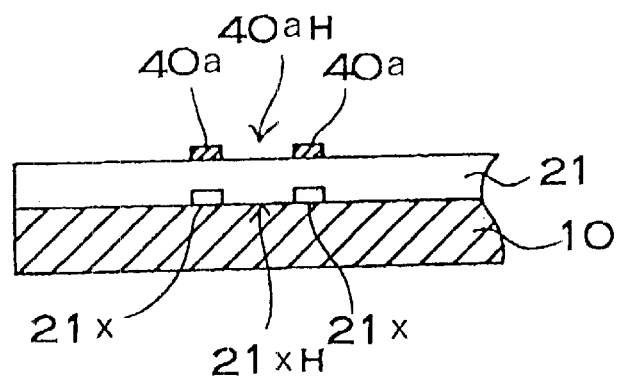
FIG. 9(b) is an enlarged cross-sectional view at A—A in FIG. 9(a).

Turning to FIGS. 9(a) and 9(b), a solar battery module 2 of the second embodiment is shown during fabrication. In FIG. 9(a), 40a and 40c are conductive paste output terminals extending parallel to the left and right edges of the substrate 10 respectively. The output terminals 40a and 40c conduct output from solar battery elements 11a, 11b, and 11c to external points. In addition, the output terminals 40a and 40c have circular open regions 40aH and 40cH corresponding to openings 28 discussed later. Since detailed description of the solar battery module 2 structure is the same as that disclosed in Japanese Patent Application HEI 7-231015 (1995), explanation is abbreviated.

FIG. 9(b) shows the cross-sectional structure of output terminal 40a. Since the cross-sectional structure of output terminal 40c is the same as that of output terminal 40a, its description is omitted. Further, since the substrate right side output section has the same method of fabrication and structure as the left side, its description is omitted in the following.

Figure 10A:
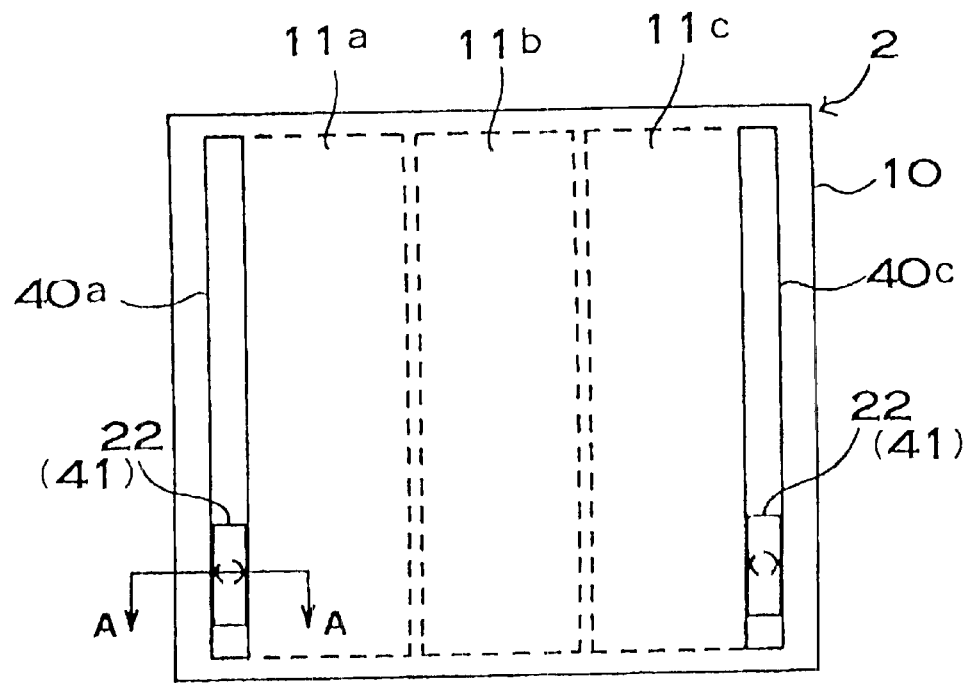
FIG. 10(a) is a plan view showing the second process step of the second embodiment of the present invention.
Figure 10B:
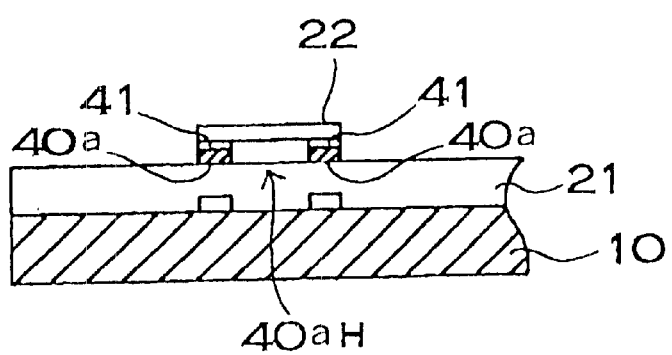
FIG. 10(b) is an enlarged cross-sectional view at A—A in FIG. 10(a).

Next, in the process step shown in FIGS. 10(a) and 10(b), a rectangular piece of metal foil 22 is attached over output terminal 40a near its lower end via conductive adhesive 41. Here, the conductive adhesive 41 is applied to the bottom of the metal foil 22, excluding the circular region corresponding to the open region 40aH. Acrylic based adhesives impregnated with metal powder such as nickel can be used as the conductive adhesive. It is also possible to use an anisotropic conductive film, in the same manner as the first embodiment, in place of the conductive adhesive 41.

Figure 11A:
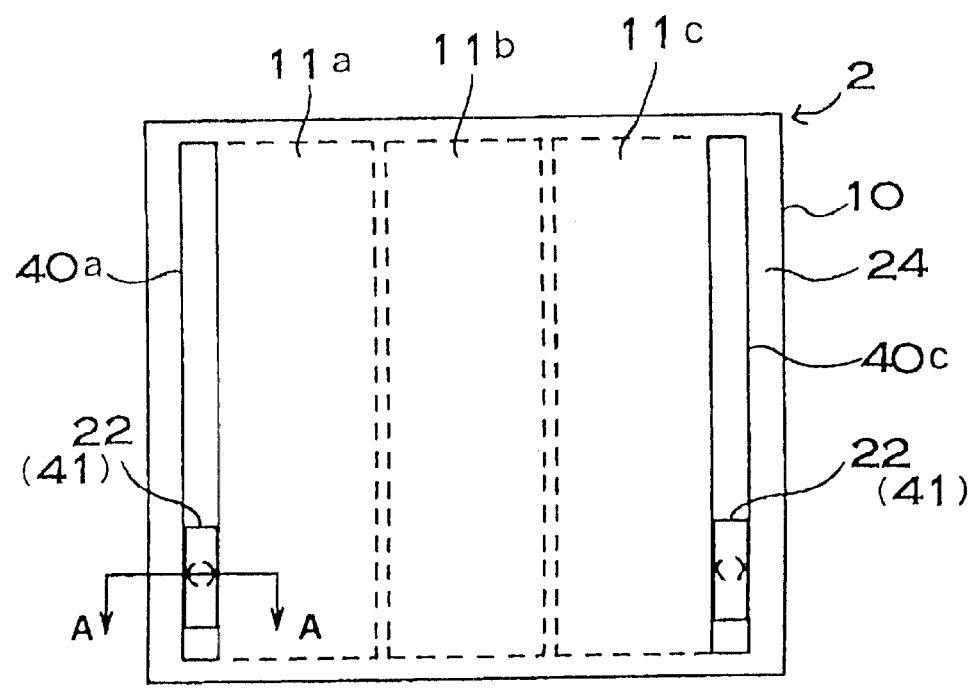
FIG. 11(a) is a plan view showing the third process step of the second embodiment of the present invention.
Figure 11B:
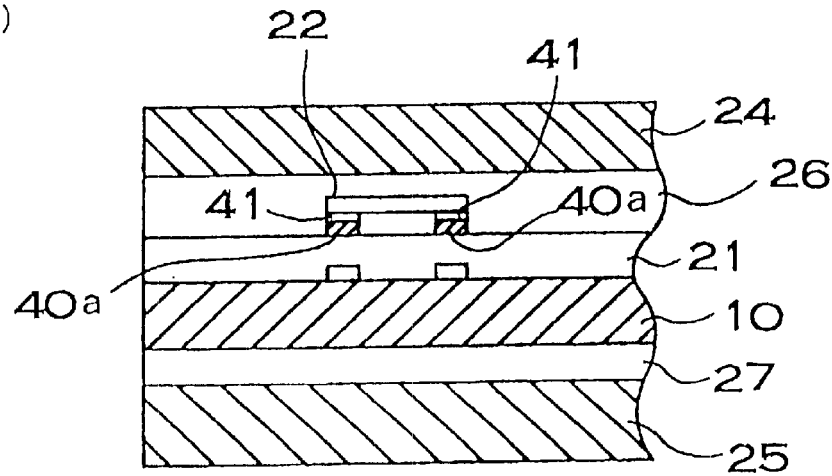
FIG. 11(b) is an enlarged cross-sectional view at A—A in FIG. 11(a).

Next, in the process step shown in FIGS. 11(a) and 11(b), a front side transparent protective film 24 is formed over the entire solar battery module 2 front side, and a back side protective film 25 is formed over the entire substrate back side. These protective film layers 24, 25 are formed by using intervening adhesion layers 26, 27, respectively.

Figure 12A:
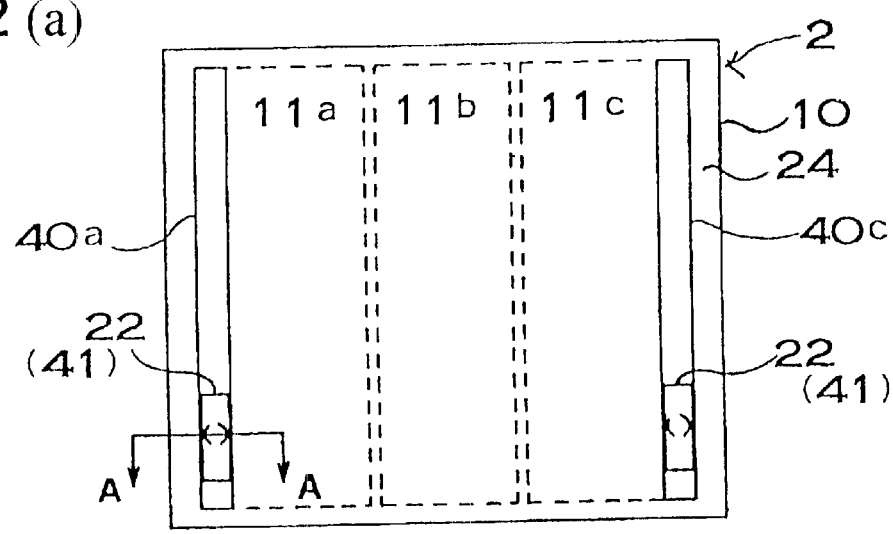
FIG. 12(a) is a plan view showing the fourth process step of the second embodiment of the present invention.
Figure 12B:
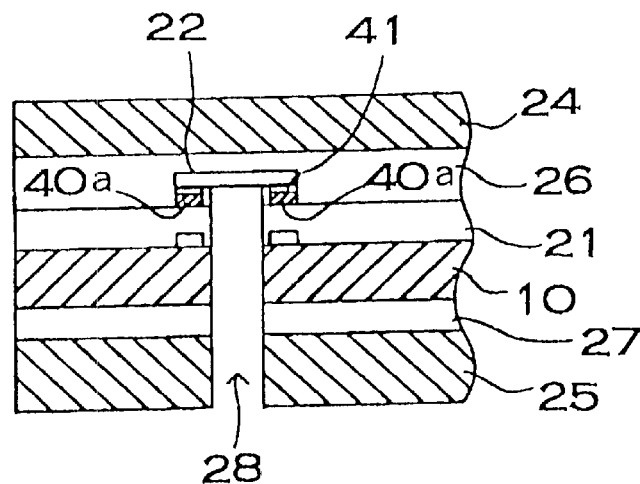
FIG. 12(b) is an enlarged cross-sectional view at A—A in FIG. 12(a)
Figure 12C:
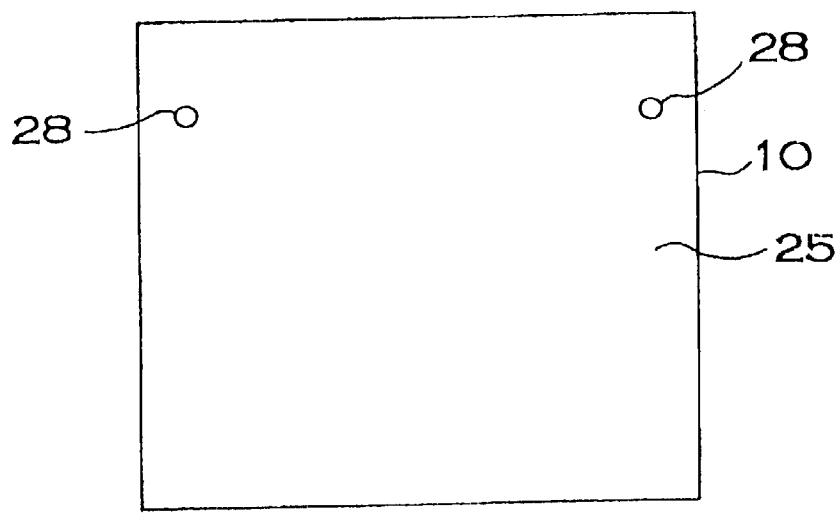
FIG. 12(c) is a bottom view of FIG. 12(a).

Next, as shown in FIGS. 12(a), 12(b) and 12(c) a circular opening 28 (1 mm to 2 mm diameter) is provided from the back side protective film 25 to the metal foil 22. As a result, the back side of the metal foil 22 is exposed inside the opening 28. Concerning the method of providing an opening 28, a cut-out method using a circular periphery cutter (Thomson type cutter) is employed. The stroke of the cutter is adjusted so that the tip of the cutter blade reaches, and cuts slightly into the metal foil 22 during the cut-out operation. In this type of cut-out method, the stroke of the cutter can be adjusted in increments of approximately 10 $\mu$m. Since the total film thickness of the metal foil 22 is approximately 140 $\mu$m as described in the first embodiment above, by adjusting the cutter stroke so that the cutter will not pierce completely through the metal foil 22, and cuts to a slight degree into the foil, process dispersion in this step during mass production (i.e. in some cases the cutter does not reach the metal foil 22 and in some cases the cutter passes completely through the metal foil 22) can be absorbed and an opening 28, as shown in FIG. 12, can be established. Concerning the shape of the opening 28 or more specifically the shape of the cutter, it must be mentioned that it is not limited to a circular shape and shapes such as square or polygonal may also be used.

In the cut-out region (the region of opening 28), conductive adhesive 41 is not applied to the circular region corresponding to the open region 40aH. Therefore, the remaining laminate core within the opening 28 (specifically, output terminal area laminate 21, substrate 10, adhesive layer 27, and back side protective film 25) can also be easily removed.

Figure 13:
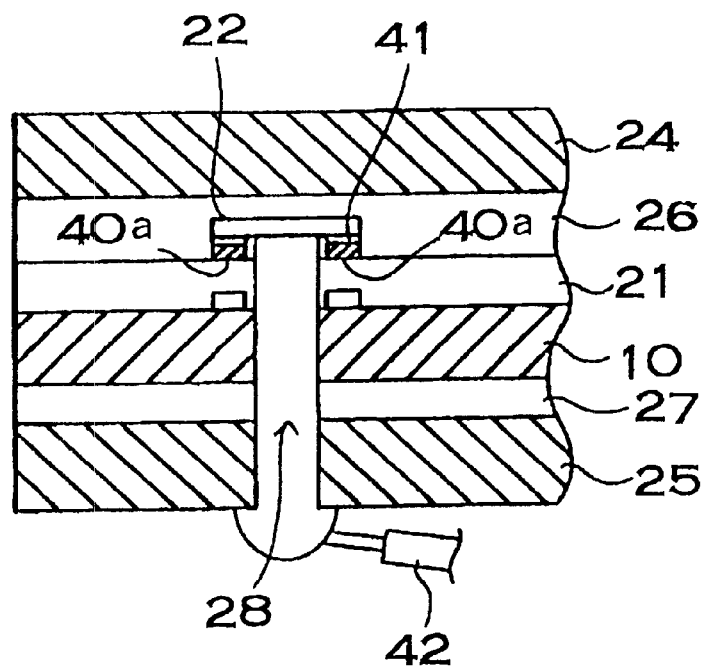
FIG. 13 is a cross-sectional view showing important elements of the fifth process step of the second embodiment of the present invention.
Figure 14:
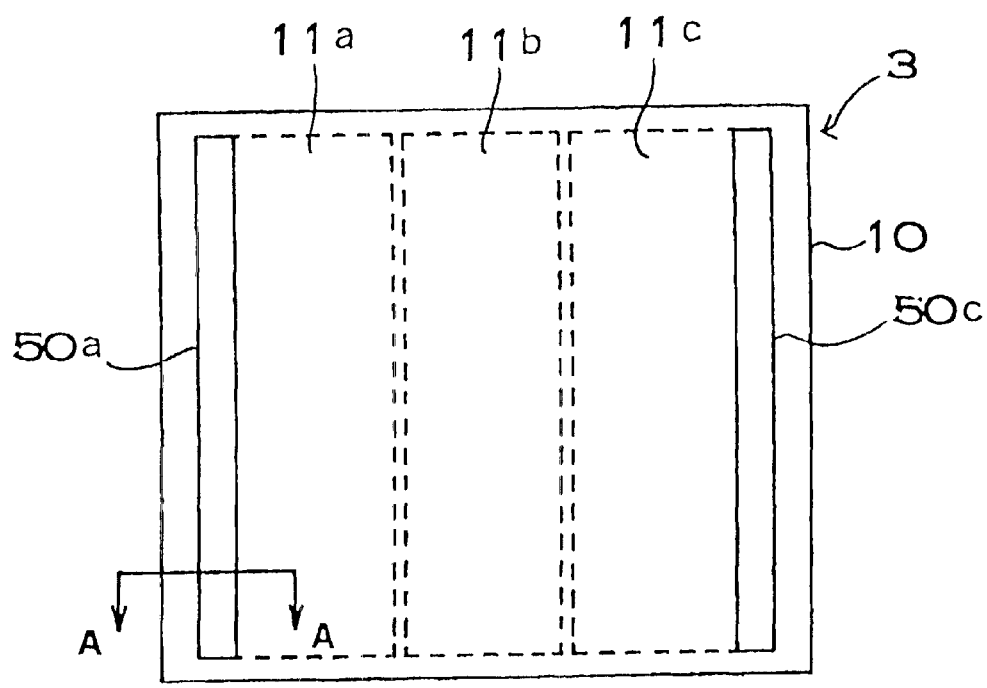
FIG. 14(a) is a plan view showing the first process step of the third embodiment of the present invention.
FIG. 14(b) is an enlarged cross-sectional view at A—A in FIG. 14(a).
Figure 14:
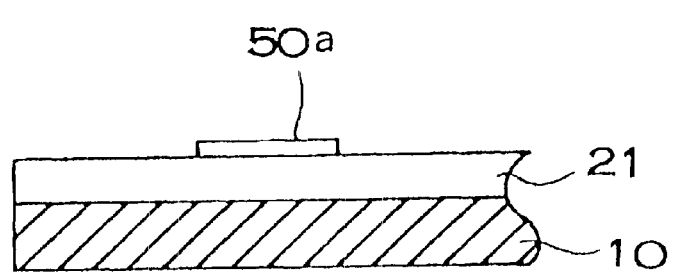
Figure 15:
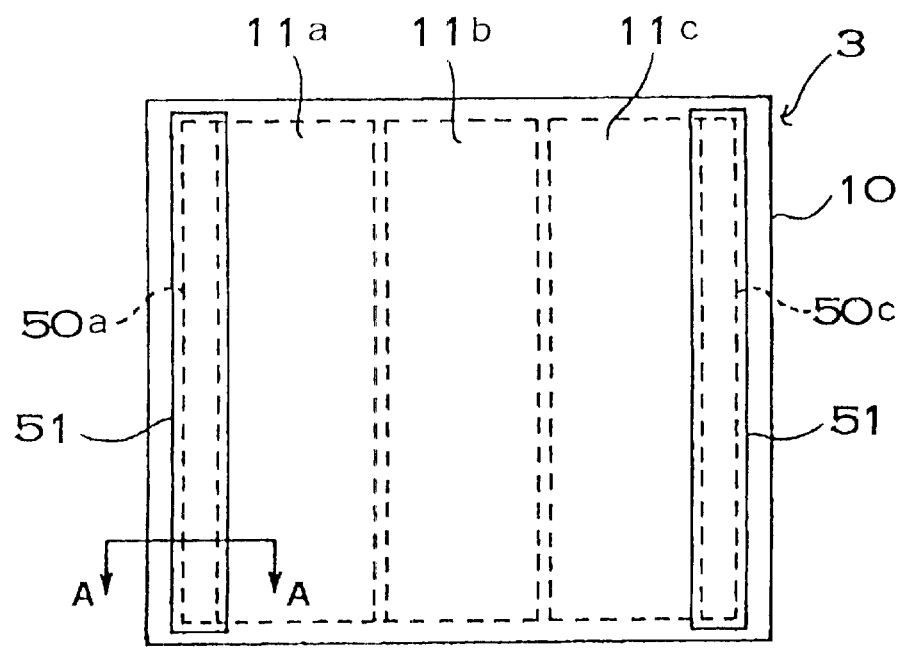
FIG. 15(a) is a plan view showing the second process step of the third embodiment of the present invention.
FIG. 15(b) is an enlarged cross-sectional view at A—A in FIG. 15(a).
Figure 15:
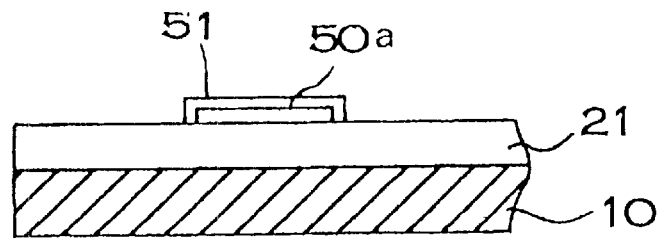

Finally, in the process step shown in FIG. 13, a lead wire 42 is solder attached to the back side of the metal foil 22 from the back side of the solar battery to complete fabrication of the second embodiment of the solar battery including the output section.

A third embodiment of the present invention is now described with reference to FIGS. 14(a) through 18. Here, structural elements which are the same as those of the first embodiment use the same names and labels, and their description is abbreviated.

Turning to FIGS. 14(a) and 14(b), a solar battery module 3 of the third embodiment is shown during fabrication. In FIG. 14(a), 50a and 50c are conductive paste output terminals extending parallel to left and right edges of the substrate 10, respectively. The output terminals 50a and 50c conduct output from solar battery elements 11a, 11b, and 11c to external points. Here, the output terminals 50a and 50c are formed to a total film thickness of approximately 30 μm to 60 μm by several repeated processes according to the following screen printing method. The conductive paste for the output terminals 50a and 50c is a material such as polyimide or phenol based binder with powdered conductive material such as silver, nickel, or aluminum included. After patterning the conductive paste according to the screen printing method, it is baked dry at about 150° C. Each of a screen printing and drying cycle forms a conductive paste layer approximately 10 μm to 20 μm thick. With suitable modification of parameters such as screen printing conditions and materials, it is also possible to obtain the desired film thickness of approximately 30 μm to 60 μm with a single screen printing cycle.

Since detailed description of the solar battery module 3 structure is the same as that disclosed in Japanese Non-examined Patent Publication HEI 7231015 (1995), explanation is abbreviated.

FIG. 14(b) shows the cross-sectional structure of output terminal 50a. Since the cross-sectional structure of output terminal 50c is the same as that of output terminal 50a, its description is omitted. In FIG. 14(b), 21 is an output terminal area laminate. As disclosed in Japanese Non-examined Patent Publication HEI 7-231015 (1995), the output terminal area laminate 21 from the substrate 10, is conductive paste, a backside electrode layer, a light active semiconductor layer such as amorphous silicon, and a transparent conductive layer. However, for applications such as indoor use when it is not necessary to get a high power output, the conductive paste may be omitted from the output terminal area laminate 21.

Again, since the substrate right side output section has the same method of fabrication and structure as the left side, its description is omitted in the following.

Next, in the process step shown in FIGS. 15(a) and 15(b), a resin film 51, such as transparent epoxy, acrylic, or PET is formed using a screen printing method.

Figure 16:
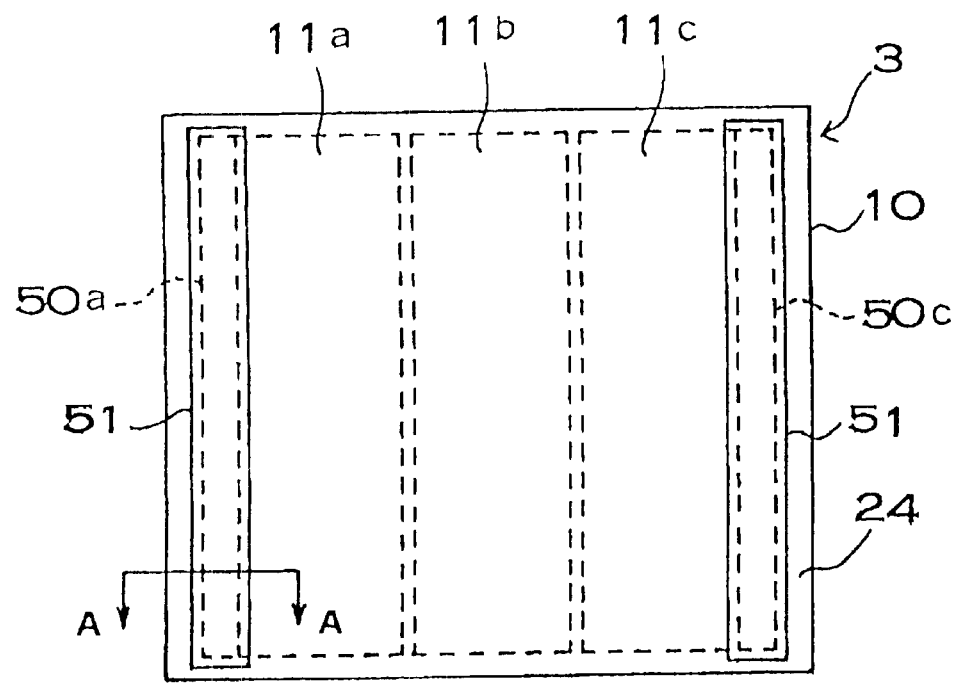
FIG. 16(a) is a plan view showing the third process step of the third embodiment of the present invention.
FIG. 16(b) is an enlarged cross-sectional view at A—A FIG. 16(a).
Figure 16:
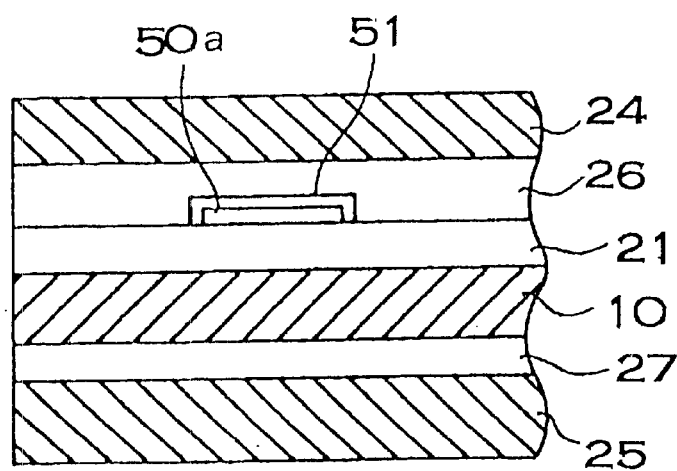
Figure 17:
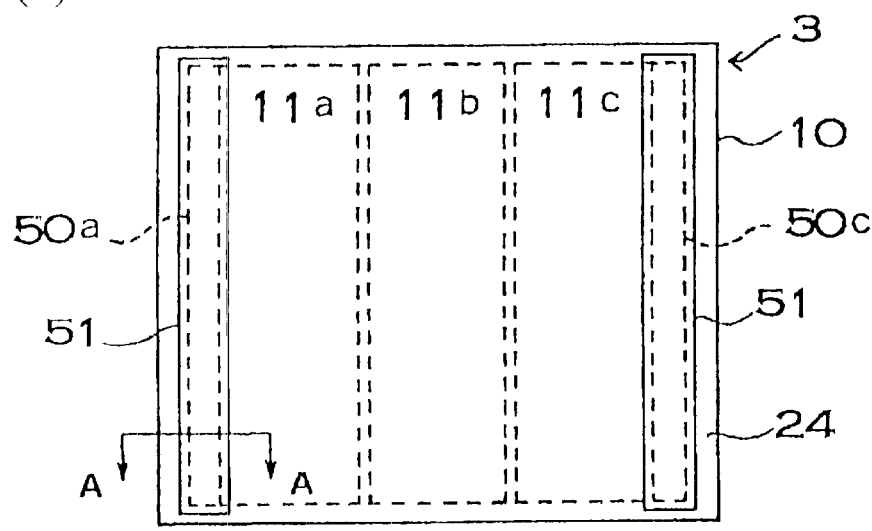
FIG. 17(a) is a plan view showing the fourth process step of the third embodiment of the present invention.
FIG. 17(b) is an enlarged cross-sectional view at A—A in FIG. 17(a)
FIG. 17(c) is a bottom view of FIG. 17(a).
Figure 17:
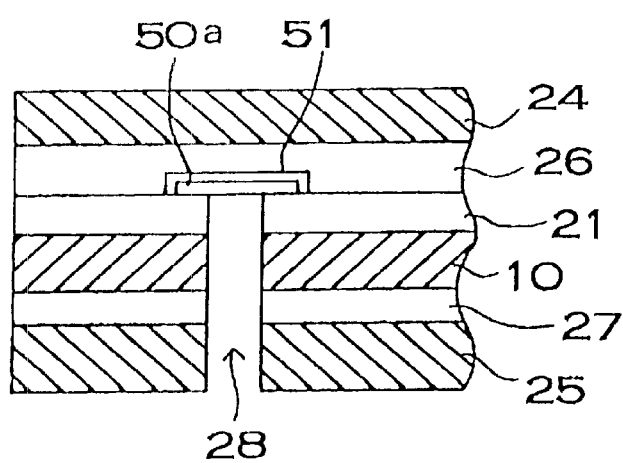
Figure 17:
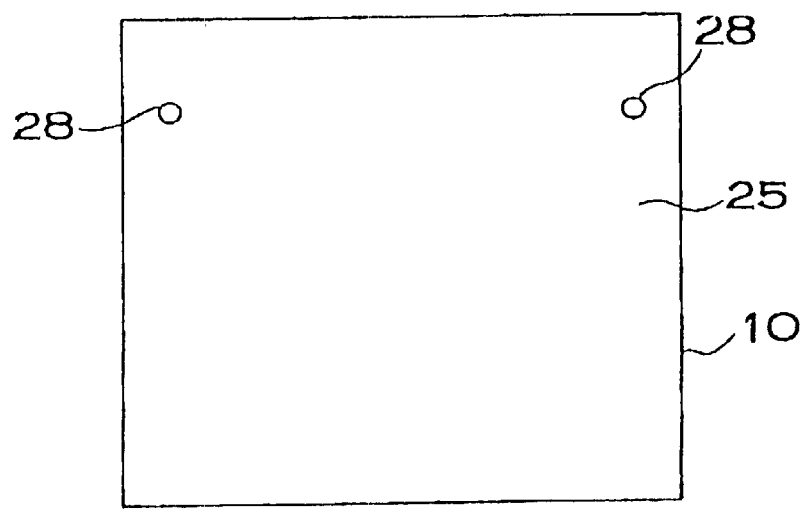

Next, in the process step shown in FIG. 16, a front side transparent protective film 24 is formed over the entire solar battery module 3 front side, and a back side protective film 25 is formed over the entire substrate back side. These protective film layers 24, 25 are formed by using intervening adhesion layers 26, 27, respectively.

Next, as shown in FIG. 17(b), a circular opening 28 (1 mm to 2 mm diameter) is provided from the back side protective film 25 to the output terminal 50a. As a result, the back side of the output terminal 50a is exposed inside the opening 28. concerning the method of providing an opening 28, a cut-out method using a circular periphery cutter (Thomson type cutter) is employed. The stroke of the cutter is adjusted so that the tip of the cutter blade reaches, and cuts slightly into the output terminal 50a during the cut-out operation. In this type of cut-out method, the stroke of the cutter can be adjusted in increments of approximately 10 μm. Since the total film thickness of the output terminal 50a described above is approximately 30 μm to 6 μm, and by adjusting the cutter stroke so that the cutter will not pierce completely through the output terminal 50a, and cuts to a slight degree of cut into the output terminal, process dispersion in this step during mass production (i.e, in some cases the cutter does not reach the output terminal 50a and in some cases the cutter passes completely through the output terminal 50a) can be absorbed and an opening 28, as shown in FIG. 17(b), can be established. Again, concerning the shape of the opening 28 or more specifically the shape of the cutter, it must be mentioned that it is not limited to a circular shape and shapes such as square or polygonal may also be used.

In the cut-out region (the region of opening 28), adhesive strength between the transparent conductive layer at the surface of the laminate 21 and the conductive paste output terminal 50a is relatively low. Conversely, since the conductive paste of the output terminal 50a includes powder particulates, its surface is rough and since the resin film 51 is disposed on that rough surface, attachment strength between the conductive paste output terminal 50a and the resin film 51 is relatively high. Consequently, the output terminal 50a easily delaminates at its interface with the transparent conductive layer of the laminate 21, and the remaining laminate core within the opening 28 (specifically, output terminal area laminate 21, substrate 10, adhesive layer 27, and back side protective film 25) can be easily removed.

Figure 18:
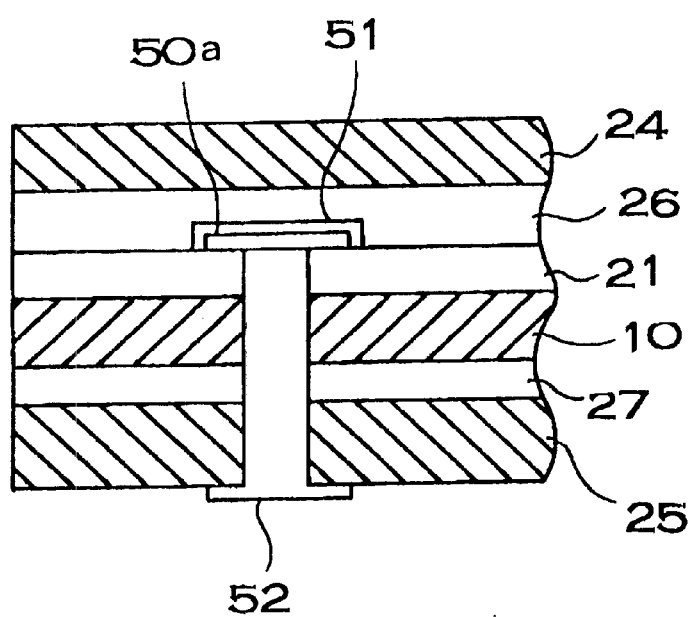
FIG. 18 is a cross-sectional view showing important elements of the fifth process step of the third embodiment of the present invention.

Finally, in the process step shown in FIG. 18, conductive material 52 such as conductive paste is established inside the opening 28 from the back side. Subsequently, a conductor such as a lead wire is connected onto the conductive material 52, and a solar battery 3 output can be extracted.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within the meets and bounds of the claims or equivalence of such meets and bounds thereof are therefore intended to be embraced by the claims.

What is claimed is:

1. A method for fabricating a solar battery output section, wherein the solar battery output section is to receive output from a solar battery device element formed on a substrate, said method comprising:

establishing a conductive portion for an output terminal that is formed on a surface of an insulating substrate, wherein the conductive portion is to receive output from a solar battery device element that is formed on said surface of said insulating substrate;

forming a protective film on said insulating substrate such that said protective film covers said conductive portion; and providing an opening from one of an outer side of said insulating substrate and an outer side of said protective film, after forming said protective film on said insulating substrate, such that said opening extends from the outer side of said insulating substrate to said conductive portion or from the outer side of said protective film to said conductive portion.

2. The method according to claim 1, wherein establishing the conductive portion comprises establishing a thick conductive portion.

3. The method according to claim 2, wherein establishing the thick conductive portion comprises establishing a conductive portion having a thickness of from 50 $\mu$m to 300 $\mu$m.

4. A method for fabricating a solar battery output section, wherein the solar battery output section is to receive output from a solar battery device element formed on a substrate, said method comprising:
   establishing a metal foil on an output terminal that is formed on a surface of an insulating substrate, wherein the metal foil is to receive output from a solar battery device element that is formed on said surface of said insulating substrate; and
   providing an opening in said insulating substrate such that said opening extends from an opposite surface of said insulating substrate to said metal foil.

5. The method according to claim 4, wherein providing the opening in said insulating substrate comprises using a Thompson cutter to cut said insulating substrate from said opposite surface to said metal foil.

6. The method according to claim 4, further comprising after providing the opening, soldering a lead wire to said metal foil from said opposite surface of said insulating substrate.

7. The method according to claim 4, wherein establishing the metal foil on the output terminal comprises providing an anisotropic film between said metal foil and said output terminal, and applying heat and pressure to said metal foil such that said anisotropic film is rendered conductive.

8. The method according to claim 4, wherein establishing the metal foil on the output terminal comprises attaching said metal foil to said output terminal via a conductive adhesive.

9. The method according to claim 8, wherein attaching said metal foil to said output terminal via a conductive adhesive comprises attaching said metal foil to said output terminal via an acrylic based adhesive with metal powder dispersed throughout.

10. The method according to claim 4, further comprising disposing an adhesive tape over said metal foil to fix said metal foil on said output terminal.

11. The method according to claim 10, wherein disposing the adhesive tape over said metal foil to fix said metal foil on said output terminal comprises disposing a polyethylene terephthalate film with an adhesive layer on one side thereof over said metal foil to fix said metal foil on said output terminal.

12. The method according to claim 4, further comprising covering said surface of said insulating substrate and said opposite surface of said insulating with protective films, respectively, prior to providing the opening in said insulating substrate.

13. The method according to claim 12, wherein covering said surface of said insulating substrate and said opposite surface of said insulating with protective films, respectively, comprises covering said surface of said insulating substrate and said opposite surface of said insulating substrate each with a plastic film having a thickness of between 25 $\mu$m and 1000 $\mu$m.

14. The method according to claim 12, wherein covering said surface of said insulating substrate and said opposite surface of said insulating with protective films, respectively, comprises adhering a protective film to each of said surface of said insulating substrate and said opposite surface of said insulating substrate via an adhesive layer of thermoplastic resin that is laminated on one side of each of said protective films.

15. The method according to claim 14, wherein adhering a protective film to each of said surface of said insulating substrate and said opposite surface of said insulating substrate via an adhesive layer of thermoplastic resin that is laminated on one side of each of said protective films comprises adhering a protective film to each of said surface of said insulating substrate and said opposite surface of said insulating substrate via an adhesive layer of one of ethylene vinyl acetate copolymer and polyvinyl butyl that is laminated on one side of each of said protective films.

16. A method for fabricating a solar battery output section, wherein the solar battery output section is to receive output from a solar battery device element formed on a substrate, said method comprising:
   establishing a metal foil on an output terminal that is formed on a surface of an insulating substrate, wherein the metal foil is to receive output from a solar battery device element that is formed on said surface of said insulating substrate;
   forming a protective film on said insulating substrate such that said protective film covers said metal foil; and
   providing an opening in said protective film such that said opening extends from a surface of said protective film to said metal foil.

17. The method according to claim 16, wherein providing the opening in said insulating substrate comprises using a Thompson cutter to cut said insulating substrate from said opposite surface to said metal foil.

18. The method according to claim 16, wherein establishing the metal foil on the output terminal comprises providing an anisotropic film between said metal foil and said output terminal, and applying heat and pressure to said metal foil such that said anisotropic film is rendered conductive.

19. The method according to claim 16, wherein establishing the metal foil on the output terminal comprises attaching said metal foil to said output terminal via a conductive adhesive.

20. The method according to claim 19, wherein attaching said metal foil to said output terminal via a conductive adhesive comprises attaching said metal foil to said output terminal via an acrylic based adhesive with metal powder dispersed throughout.

21. The method according to claim 16, further comprising disposing an adhesive tape over said metal foil to fix said metal foil on said output terminal.

22. The method according to claim 21, wherein disposing the adhesive tape over said metal foil to fix said metal foil on said output terminal comprises disposing a polyethylene terephthalate film with an adhesive layer on one side thereof over said metal foil to fix said metal foil on said output terminal.

23. The method according to claim 16, further comprising covering said surface of said insulating substrate and said opposite surface of said insulating with protective films, respectively, prior to providing the opening in said insulating substrate.

24. The method according to claim 23, wherein covering said surface of said insulating substrate and said opposite surface of said insulating with protective films, respectively, comprises covering said surface of said insulating substrate and said opposite surface of said insulating substrate each with a plastic film having a thickness of between 25 $\mu$m and 1000 $\mu$m.

25. The method according to claim 24, wherein covering said surface of said insulating substrate and said opposite surface of said insulating substrate each with a plastic film having a thickness of between 25 μm and 1000 μm comprises adhering a plastic film having a thickness of between 25 μm and 1000 μm to each of said surface of said insulating substrate and said opposite surface of said insulating substrate via an adhesive layer of thermoplastic resin that is laminated on one side of each of said plastic films.

26. The method according to claim 25, wherein adhering a plastic film having a thickness of between 25 μm and 1000 μm to each of said surface of said insulating substrate and said opposite surface of said insulating substrate via an adhesive layer of thermoplastic resin that is laminated on one side of each of said plastic films comprises adhering a plastic film having a thickness of between 25 μm and 1000 μm to each of said surface of said insulating substrate and said opposite surface of said insulating substrate via an adhesive layer of one of ethylene vinyl acetate copolymer and polyvinyl butyl that is laminated on one side of each of said plastic films.

27. A method for fabricating a solar battery output section, wherein the solar battery output section is to receive output from la solar battery device element formed on a substrate, said method comprising:
   establishing a conductive paste as an output terminal that is formed on a surface of an insulating substrate, wherein the conductive paste is to receive output from a solar battery device element that is formed on said surface of said insulating substrate;
   forming a resin film on said insulating substrate such that said resin film covers said conductive paste; and
   providing an opening in said insulating substrate after forming said resin film such that said opening extends from an opposite surface of said insulating substrate to said conductive paste.

28. The method according to claim 27, wherein providing the opening in said insulating substrate comprises using a Thompson cutter to cut said insulating substrate from said opposite surface to said conductive paste.

29. The method according to claim 27, wherein establishing the conductive paste as an output terminal comprises screen printing said conductive paste on said insulating substrate to a thickness of between 30 μm and 60 μm.

30. The method according to claim 27, wherein establishing the conductive paste as an output terminal comprises
   (i) screen printing said conductive paste on said insulating substrate,
   (ii) drying the screen printed conductive paste, and
   (iii) repeating (i) and (ii) until said conductive paste screen printed on said insulating substrate reaches a thickness of between 30 μm and 60 μm.

31. The method according to claim 27, wherein forming the resin film on said insulating substrate comprises screen printing a resin material on said insulating substrate.

32. The method according to claim 27, further comprising disposing conductive material within said opening from said opposite surface of said substrate.

33. The method according to claim 27, further comprising covering said surface of said insulating substrate and said opposite surface of said insulating with protective films respectively, prior to providing the opening in said insulating substrate.

34. The method according to claim 33, wherein covering said surface of said insulating substrate and said opposite surface of said insulating with protective films, respectively, comprises covering said surface of said insulating substrate and said opposite surface of said insulating substrate each with a plastic film having thickness of between 25 μm and 1000 μm.

35. The method according to claim 34, wherein covering said surface of said insulating substrate and said opposite surface of said insulating substrate each with a plastic film having a thickness of between 25 μm and 1000 μm comprises adhering a plastic film having a thickness of between 25 μm and 1000 μm to each of said surface of said insulating substrate and said opposite surface of said insulating substrate via an adhesive layer of thermoplastic resin that is laminated on one side of each of said plastic films.

36. The method according to claim 35, wherein adhering a plastic film having a thickness of between 25 μm and 1000 μm to each of said surface of said insulating substrate and said opposite surface of said insulating substrate via an adhesive layer of thermoplastic resin that is laminated on one side of each of said plastic films comprises adhering a plastic film having a thickness of between 25 μm and 1000 μm to each of said surface of said insulating substrate and said opposite surface of said insulating substrate via an adhesive layer of one of ethylene vinyl acetate copolymer and polyvinyl butyl that is laminated on one side of each of said plastic films.

37. The method according to claim 1, wherein establishing the thick conductive portion comprises establishing a conductive portion having a thickness of from 30 μm to 60 μm.

* * * * *